(12) United States Patent
Lee

(10) Patent No.: US 9,117,539 B2
(45) Date of Patent: Aug. 25, 2015

(54) FLASH MEMORY DEVICE REDUCING NOISE PEAK AND PROGRAM TIME AND PROGRAMMING METHOD THEREOF

(71) Applicants: FIDELIX CO., LTD., Seongnam-si, Gyeonggi-do (KR); Nemostech Co., Ltd., Seongnam-si, Gyeonggi-do (KR)

(72) Inventor: Jong Cheol Lee, Seoul (KR)

(73) Assignees: FIDELIX CO., LTD., Seongnam-Si, Gyeonggi-Do (KR); NEMOSTECH CO., LTD., Seongnam-Si, Gyeonggi-Do (KR)

( * ) Notice: Subject to any disclaimer, the term of this patent is extended or adjusted under 35 U.S.C. 154(b) by 0 days.

(21) Appl. No.: 14/303,061

(22) Filed: Jun. 12, 2014

(65) Prior Publication Data
US 2015/0063029 A1   Mar. 5, 2015

(30) Foreign Application Priority Data
Sep. 2, 2013  (KR) .......................... 10-2013-0104951

(51) Int. Cl.
*G11C 11/34* (2006.01)
*G11C 16/34* (2006.01)
*G11C 16/10* (2006.01)
*G06F 13/28* (2006.01)

(52) U.S. Cl.
CPC ................. *G11C 11/34* (2013.01); *G06F 13/28* (2013.01); *G11C 16/10* (2013.01); *G11C 16/3427* (2013.01)

(58) Field of Classification Search
CPC .... G11C 11/34; G11C 16/3427; G11C 16/10; G11C 16/0483; G11C 11/5628; G06F 13/28
See application file for complete search history.

(56) References Cited

U.S. PATENT DOCUMENTS

2006/0126390 A1*  6/2006  Gorobets et al. ......... 365/185.22
2007/0061538 A1*  3/2007  Chang et al. ................... 711/169

* cited by examiner

*Primary Examiner* — J. H. Hur
*Assistant Examiner* — Ajay Ojha
(74) *Attorney, Agent, or Firm* — Kile Park Reed & Houtteman PLLC

(57) ABSTRACT

A flash memory device reduces noise peak and program time through serial programming of program blocks of memory cells. The time interval or the number of the program groups is decreased according to the proceeding program loop in the plurality of program loops, reducing the total program time.

6 Claims, 7 Drawing Sheets

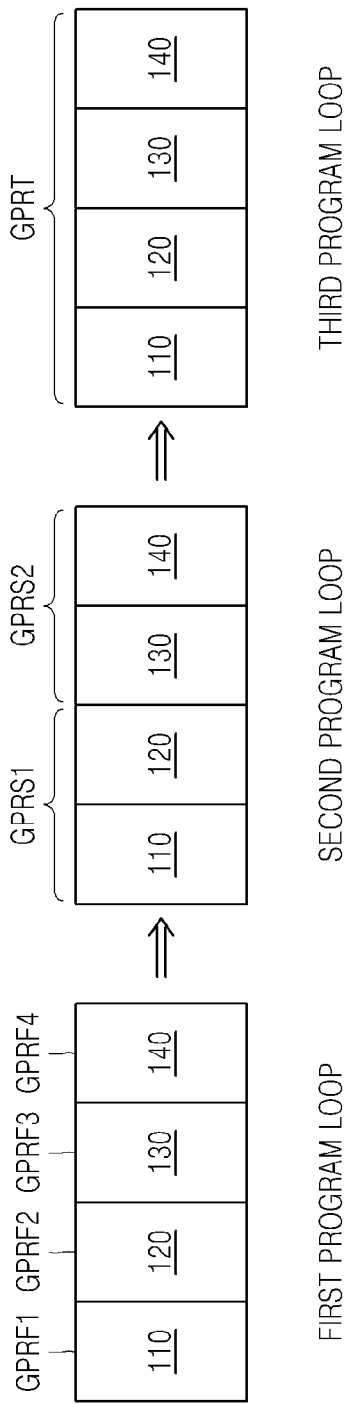

FLASH MEMORY DEVICE REDUCING NOISE PEAK AND PROGRAM TIME AND PROGRAMMING METHOD THEREOF

CROSS-REFERENCE TO RELATED APPLICATIONS

This application claims priority to and the benefit of Korean Patent Application No. 2013-0104951, filed on Sep. 2, 2013, the entire disclosure of which is incorporated herein by reference.

FIELD OF THE INVENTION

The present invention relates to a flash memory device and programming method thereof, and more particularly, to a flash memory device reducing program time and programming method thereof.

BACKGROUND

With the development of mobile systems and various application systems, a demand for flash memory device has increased. The flash memory device is capable of storing data even when no power is supplied. Generally, flash memory cells in the flash memory device are programmed using the tunneling phenomenon. During programming, the Incremental Step Pulse Program (ISPP) method is applied to make the threshold voltage distribution in the flash memory cells dense. In the ISSP method, a program voltage is applied on the flash memory cells, and then the flash memory cells are verified by comparing a threshold voltage with a verify voltage. For flash memory cells having a threshold voltage less than the verify voltage, a new higher program voltage is applied.

The programming operation of the flash memory device is performed as a page unit. At this time, the instant coupling noise may be happened between the selected bit line connected to the program memory cell and the non-selected bit line connected to the program inhibit memory cell. To reduce the peak the instant coupling noise, the flash memory cells are divided into several program blocks, and the program blocks are serially programmed. And, here is a time interval between the program starting points of the program blocks. At this time, due to the accumulation of the time intervals cause, the total program time is increased.

SUMMARY OF THE INVENTION

The present invention is directed to a flash memory device having the reduced total program time with reducing the noise peak. According to an embodiment of the present invention, a flash memory device using an ISPP program operation with a plurality of program loops is provided. The flash memory device according to an embodiment of the present invention includes a memory array having a plurality of flash memory cells arranged in matrix structure containing word lines and bit lines. The plurality of flash memory cells is divided into multiple program blocks. A program voltage providing portion is included for providing a program voltage to a selected word line and is increased according to the proceeding of the plurality of program loops. A control signal generating portion is included for providing buffer control signals. The buffer control signals are sequentially activated with a time interval in at least one of the plurality of program loops. In addition, a page buffer portion having multiple page buffers is included. Each of the multiple page buffers is enabled in response to a corresponding the buffer control signal for providing corresponding program data to bit lines of program block to which it corresponds. Here, the time interval is deceased according to the proceeding program loop in the plurality of program loops.

According to another embodiment, of the present invention, a method for programming a flash memory device having a plurality of flash memory cells is provided. The programming method of a flash memory device according to this embodiment includes a first program loop step of dividing the plurality of flash memory cells into multiple program blocks. The first program loop step provides a first program voltage to a selected word line in the multiple first program blocks and a corresponding first program data to bit lines in the first program blocks. The first program data for the multiple first program blocks are sequentially provided. A second program loop step divides the plurality of flash memory cells into multiple second program blocks. The second program loop step provides a second program voltage to the selected word line in the multiple second program blocks and a corresponding second program data to bit lines in the multiple second program blocks. The second program data for the multiple second program blocks are sequentially provided. Here, the second program voltage is higher than the first program voltage, and the number of the second program blocks is less than that of the first program blocks.

In the flash memory device according to embodiments of the present invention, the program blocks are serially programmed. As a result, in the flash memory device according to the present invention, the noise peak is reduced. In addition, the time interval or the number of program groups is reduced. As a result, in the flash memory device according to embodiments of the present invention, the total program time is ultimately reduced considerably.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 4 is a diagram for explaining the change in the number of the program group according to the change in the time interval of FIG. 3B;

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, various modifications can be made without departing from the spirit and scope of the invention.

Hereinafter, exemplary embodiments of the present invention will be described in more detail with reference to the appended drawings.

Figure 1:
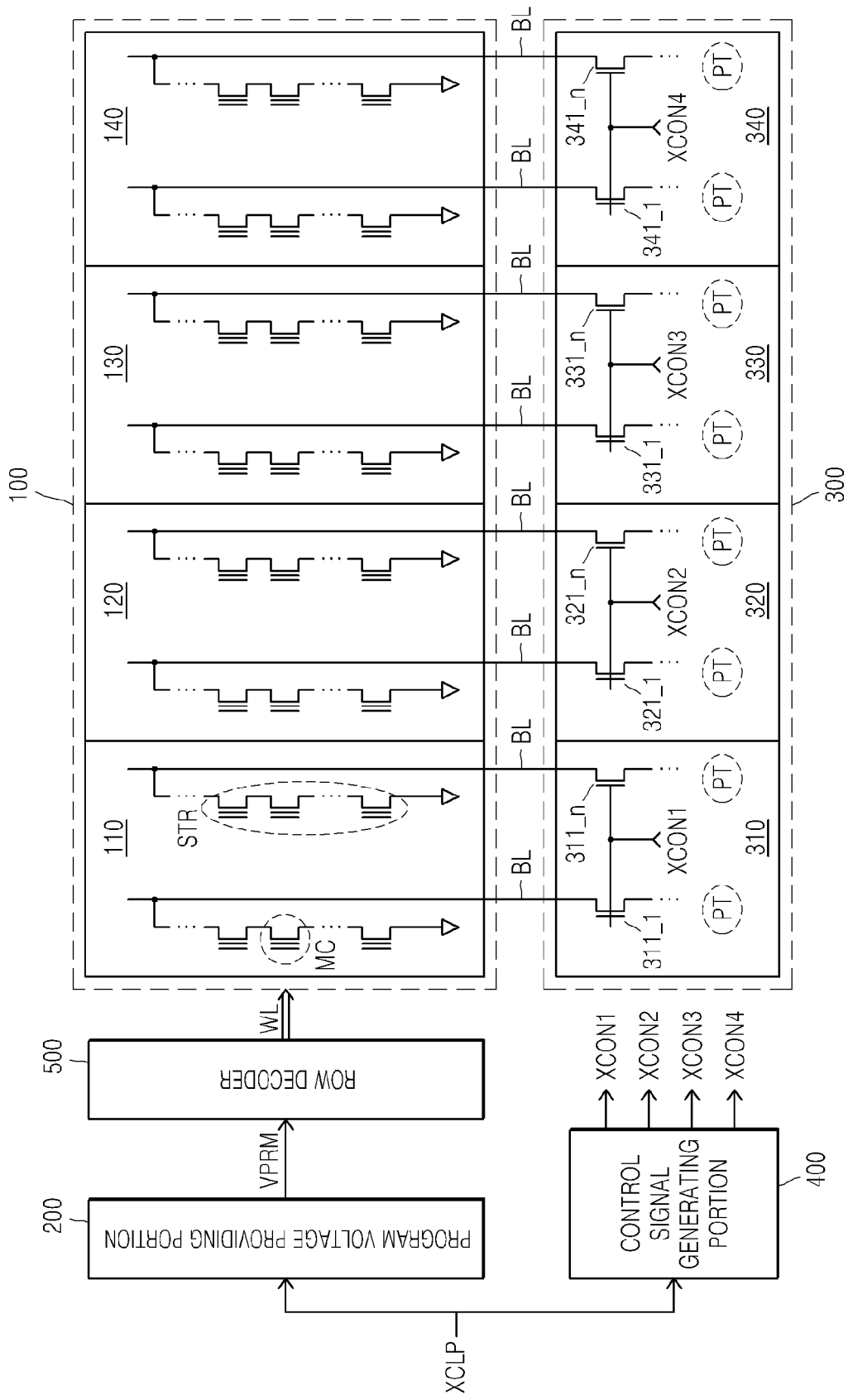
FIG. 1 is a diagram illustrating a flash memory device according to an exemplary embodiment of the present invention.

FIG. 1 is a diagram illustrating a flash memory device according to an exemplary embodiment of the present invention and illustrating a part of the flash memory device relevant to the technical spirit of the present invention rather than the entire flash memory device. The flash memory device of FIG. 1 proceeds the program operation that performs ISSP (Incremental Step Pulse Program) method. Herein, according to the ISSP method, a plurality of program loops is performed in one program cycle. The program voltage applied on the flash memory cells is increased from program loop to program loop according to the voltage applied in the proceeding program loop of the plurality of program loops.

Referring to FIG. 1, the flash memory device according to the present invention includes a memory array 100, a program voltage providing portion 200, a page buffer portion 300 and a control signal generating portion 400.

The memory array 100 has a plurality of flash memory cells MCs. The flash memory cells MCs are arranged in a matrix structure containing word lines (WLs) and bit lines (BLs). Herein, the plurality of flash memory cells MCs is divided into multiple program blocks 110, 120, 130 and 140. Preferably, the flash memory device according to one embodiment of the present invention is a NAND type. In the NAND type flash memory, a plurality of flash memory cells MCs is connected to one string (STR). The program voltage providing portion 200 provides a program voltage (VPRM) to a selected word line (WL) via a row decoder 500. Provision of the program voltage VPRM is controlled by a loop information signal XCLP. The loop information signal XCLP contains information about the proceeding state of the program loop, that is, the state of a first program loop or a second program loop, for a second program loop or third program loop.

Figure 2:
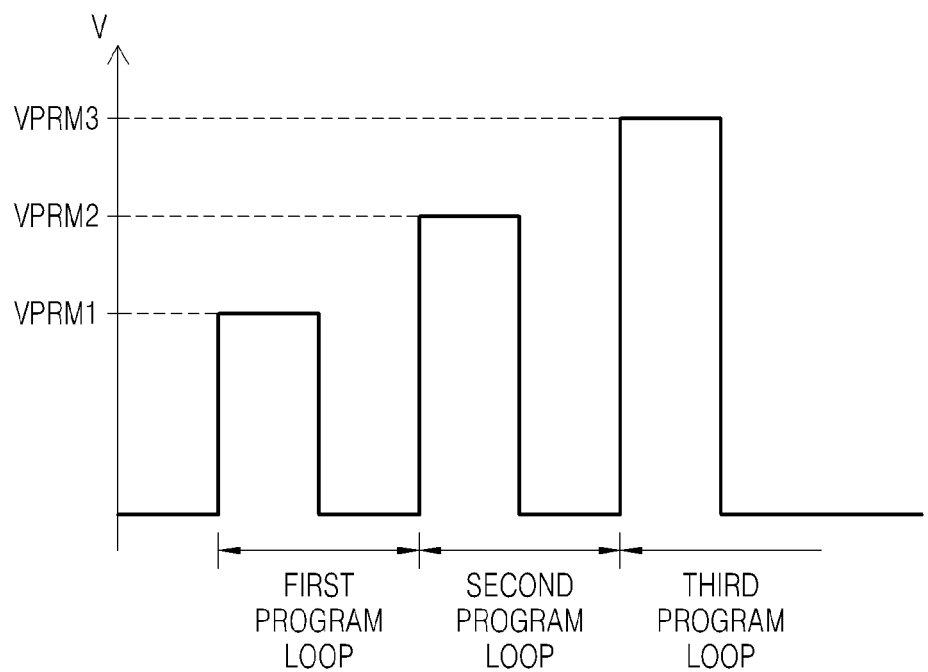
FIG. 2 is a diagram for explaining the program voltage serially increased according to the program loop progress in the flash memory device of FIG. 1.

Referring to FIG. 2, the program voltage VPRM is increased from program loop to program loop according to the program voltage in the proceeding program loop of the plurality of program loops.

Suitable program voltage providing portions 200 are known and available to one skilled in the art Therefore, specific details thereof are omitted. Returning to FIG. 1, the page buffer portion 300 includes multiple page buffers 310, 320, 330 and 340. Each one of the page buffers 310, 320, 330 and 340 corresponds to one of the program blocks 110, 120, 130 and 140 and is enabled in response to a corresponding buffer control signal XCON1, XCON2, XCON3 and XCON4. In addition, each page buffer provides corresponding program data (PT) to the bit line of its corresponding program block. For example, when a first buffer control signal XCON1 is activated, the plurality of buffer switches 311_1 to 311_$n$ in the first page buffer 310 are turned on, and the corresponding program data (PT) is provided to the bit lines (BLs) in the first program block 110.

The value of the program data (PT) is determined according to whether a selected flash memory cell MC is a program cell or a program inhibit cell. When the selected flash memory cell MC is a program cell, the value of the program data (PT) is a ground voltage VSS. When the selected flash memory cell MC is a program inhibit cell, the value of the program data (PT) is a power voltage VCC. After the program operation is performed in each program loop, information regarding whether a given flash memory cell MC is programmed is reflected in the value of its associated program data (PT). As used herein, the program data (PT) can be designated such as first program data, second program data, etc, according to the current state of the program loop.

The control signal generating portion 400 provides the corresponding buffer control signals XCON1, XCON2, XCON3 and XCON4 to the page buffers 310, 320, 330 and 340. The buffer control signals XCON1, XCON2, XCON3 and XCON4 are sequentially activated in a given time interval corresponding to one of the plurality of program loops. Since the buffer control signals XCON1, XCON2, XCON3 and XCON4 are sequentially activated, the peak of the instant noise is reduced. As used herein, the instant noise refers to the coupling noise between the selected bit line connected to the program memory cell and the non-selected bit line connected to the program inhibit memory cell. Generally, the number of programmed memory cells is increased according to the proceeding program loops, i.e., the number of the program memory cells is decreased according to the proceeding program loop in the plurality of program loops. Therefore, the peak value of the instant noise in each program block is decreased according to the proceeding program loop in the plurality of program loops. Exemplary embodiments of the present invention utilize this decrease in the peak of the instant noise in each program block according to the proceeding program loop in the plurality of program loops.

Figure 3A:
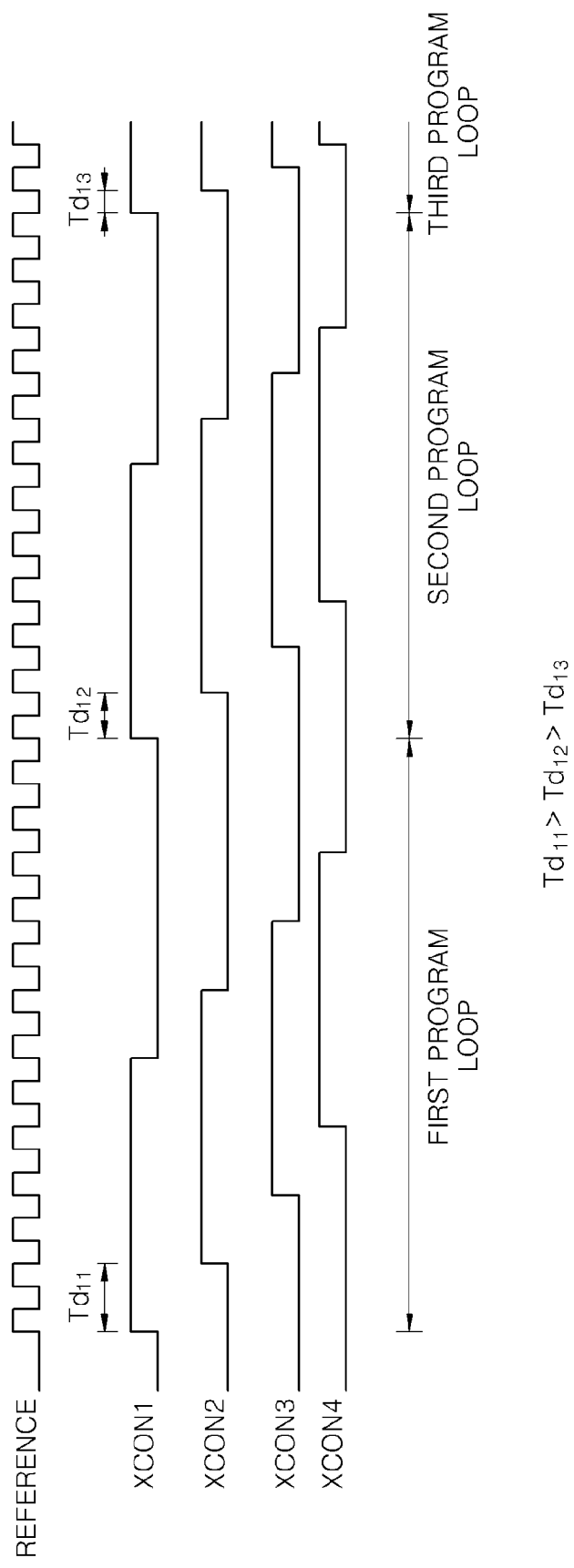
FIG. 3A and FIG. 3B are diagrams for explaining the time intervals between the active timings in the buffer control signals, the time intervals are serially decreased according to the program loop progress in the flash memory device of FIG. 1.

Referring to FIG. 3A, the time interval, e.g., $Td_{11}$, $Td_{12}$ and $Td_{13}$ between the activation time points of successive buffer control signals XCON1, XCON2, XCON3 and XCON4 during sequential activation is decreased compared to the proceeding time intervals in the plurality of program loops. In exemplary embodiments of the flash memory device in accordance with the present invention, each time interval, e.g., $Td_{11}$, $Td_{12}$ and $Td_{13}$ between the activation time points of successive buffer control signals XCON1, XCON2, XCON3 and XCON4 is controlled independently of each other. Therefore, for example, the time interval between the activation time points of any two buffer control signals can be set to "zero". At this time interval, the two program blocks corresponding to the two buffer control signals, are considered as one program group. This decreases the number of the program groups from the proceeding of the plurality of program loops.

Figure 3B:
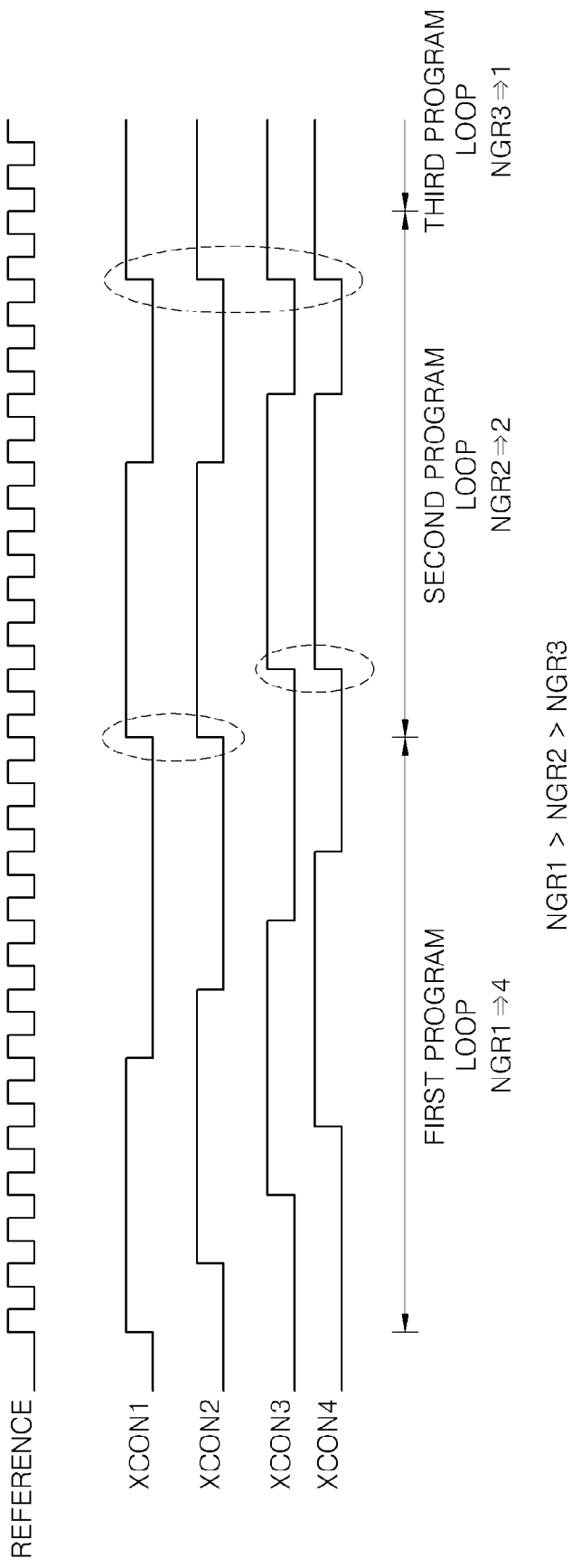

Referring to FIG. 3B, in the first program loop, the buffer control signals XCON1, XCON2, XCON3 and XCON4 are serially or sequentially activated with some time interval. In the first program loop, each of the program blocks 110, 120, 130 and 140 (FIG. 1) is separately activated as a one program group. Therefore, the flash memory cells MCs are divided into four program groups GPRF1, GPRF2, GPRF3 and GPRF4 (FIG. 4), one for each program group. This yields a program group number (NGR) for the first program loop (NGR1) (FIG. 3B) of 4. In the second program loop, the buffer control signal XCON1 and the buffer control signal XCON2 are activated at same time. Similarly, the buffer control signal XCON3 and the buffer control signal XCON4 are activated at same time. A time interval is provided between the activation time point of the first and second buffer control signals, XCON1, XCON2 and the activation time point of the third and fourth buffer control signals XCON3, XCON4. In the second program loop, the first program block 110 and the second program block 120 are treated as single program group, and the third program block 130 and the fourth program block 140 are treated as another single program group. This yields two program groups GPRS1 and GPRS2 for the flash memory cells MCs and a program group number NGR2 in the second program loop (NGR2) of 2.

In the third program loop, all four buffer control signals XCON1, XCON2, XCON3 and XCON4 are activated at same time. Therefore, in the third program loop, the program block 110, the program block 120, the program block 130 and the program block 140 are treated as single program group, and the flash memory cells MCs are treated as a single program group GPRT (FIG. 4). This yields a program group number in the third program loop (NGR3) of 1 (FIG. 3B). Suitable control signal generating portions 400 (FIG. 1) are known and available to one skilled in the art. Therefore, the specific details thereof are omitted in the present specification.

Figure 5:
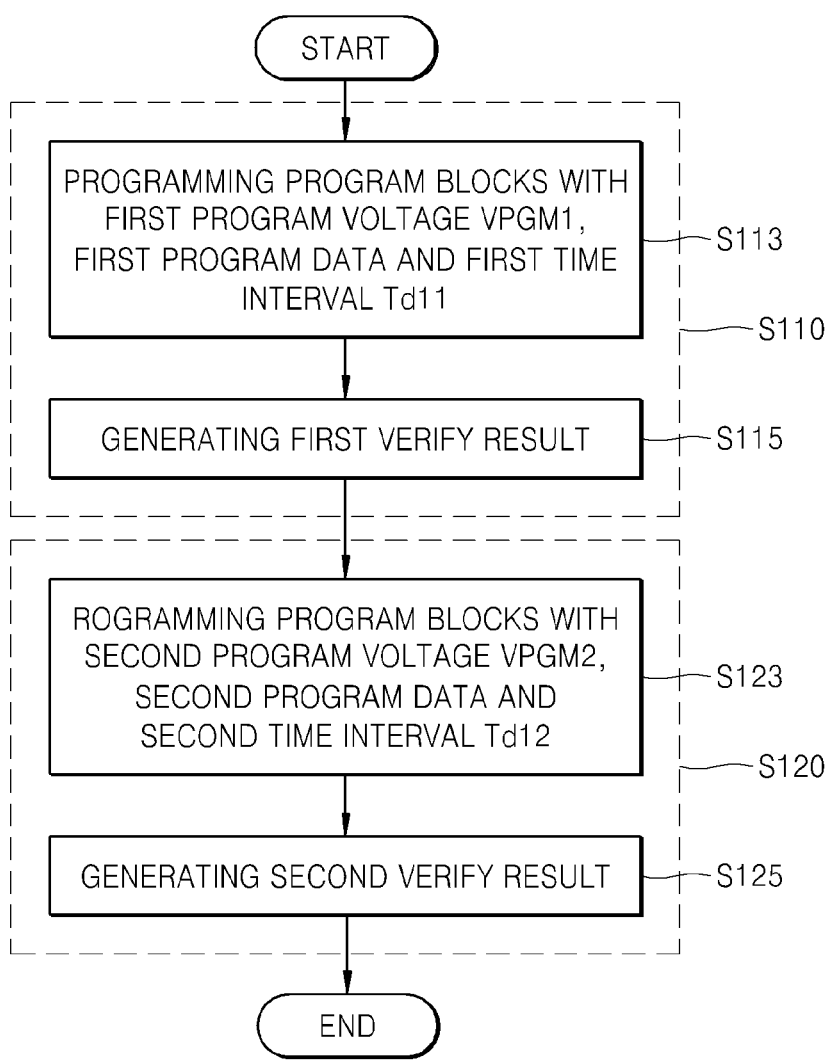
FIG. 5 is a flow chart illustrating the programming method of a flash memory device according to an exemplary embodiment of the present invention.

Regarding, the programming method of the flash memory device according to the present invention, FIG. 5 is a flow chart illustrating a programming method of a flash memory device according to an exemplary embodiment of the present invention. The programming method of FIG. 5 is applied to the flash memory device of FIG. 1. In one embodiment, the programming method of the flash memory device according to the present invention includes at least a first program loop step S110 and a second program loop step S120. The first program loop step S110 includes a step S113 and a step S115. In step S113, a plurality of flash memory cells MCs arranged in a matrix structure containing word lines WLs and bit lines BLs are divided into multiple program blocks 110, 120, 130 and 140, and a first program voltage VPGM1 is provided to a selected word line WL in the multiple program blocks 110, 120, 130 and 140. In addition, corresponding first program data are provided to bit lines BLs in the multiple program blocks 110, 120, 130 and 140. The first program data for the multiple program blocks 110, 120, 130 and 140 are sequentially provided with a first time interval $Td_{11}$. Thus, the flash memory cells MCs in the multiple program blocks 110, 120, 130 and 140 are programmed. In step S115, the program for the flash memory cells MCs in the multiple program blocks 110, 120, 130 and 140 is verified, and the first program verify result is generated.

The second program loop step S120 includes a step S123 and a step S125. In step S123, a plurality of flash memory cells MCs arranged on matrix structure containing word lines WLs and bit lines BLs is divided into multiple program blocks 110, 120, 130 and 140, and a second program voltage VPGM2 is provided to a selected word line WL in the multiple program blocks 110, 120, 130 and 140. In addition, corresponding second program data are provided to bit lines BLs in the multiple program blocks 110, 120, 130 and 140. The second program data for the multiple program blocks 110, 120, 130 and 140 are sequentially provided with a second time interval $Td_{12}$. Thus, the flash memory cells MCs in the multiple program blocks 110, 120, 130 and 140 are programmed. In step S125, the program for the flash memory cells MCs in the multiple program blocks 110, 120, 130 and 140 is verified, and the second program verify result is generated.

In one embodiment, the second time interval $Td_{12}$ is shorter than the first time interval $Td_{11}$, and the second program voltage VPGM2 is higher than the first program voltage VPGM1. Preferably, the programming method of FIG. 5 is applied to a NAND type flash memory, in which a plurality of flash memory cells MCs is connected to one string STR. According to the programming method of FIG. 5, the total programming time is reduced, compared to conventional programming methods.

Figure 6:
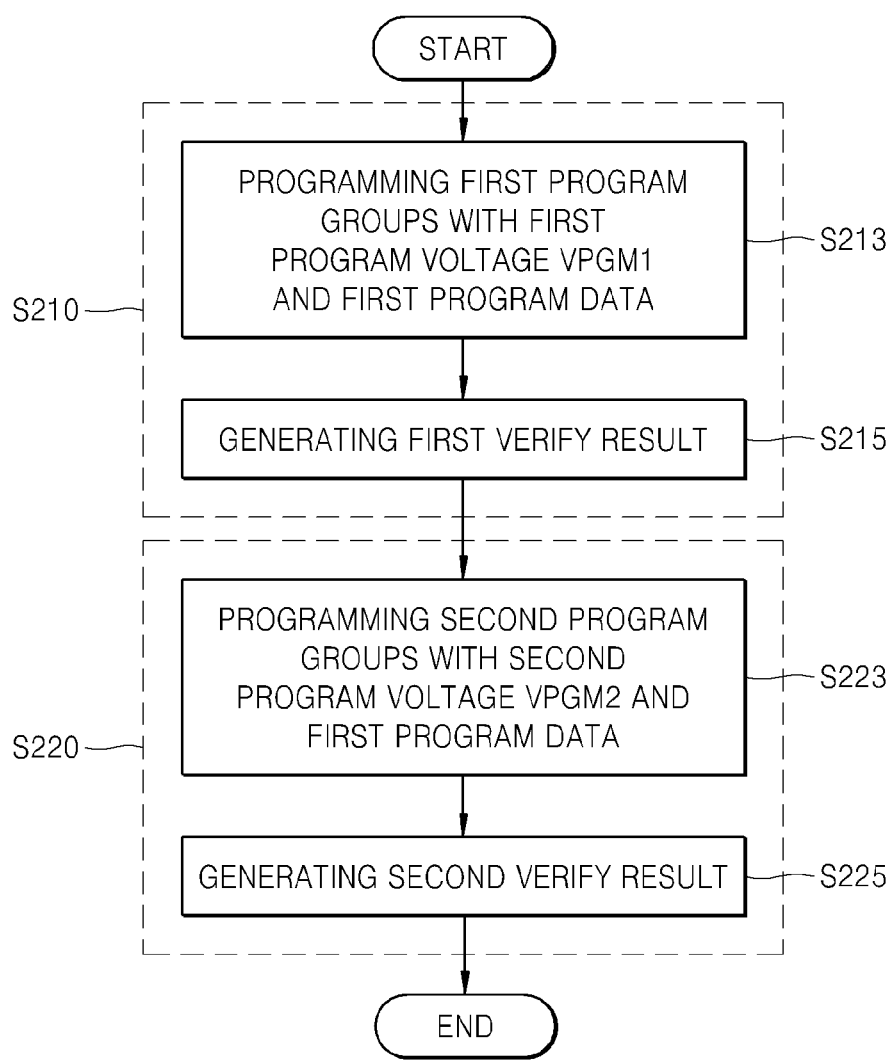
FIG. 6 is a flow chart illustrating the programming method of a flash memory device according to other exemplary embodiment of the present invention.

Regarding verifying the programming method of the flash memory device according to the present invention, FIG. 6 is a flow chart illustrating a programming method of a flash memory device according to an exemplary embodiment of the present invention. The programming method of FIG. 6 is applied to the flash memory device of FIG. 1. In one embodiment, the programming method of the flash memory device includes at least a first program loop step S210 and a second program loop step S220. The first program loop step S210 includes a step S213 and a step S215. In step S213, a plurality of flash memory cells MCs arranged on matrix structure containing word lines WLs and bit lines BLs is divided into multiple first program groups GPRF1, GPRF2, GPRF3 and GPRF4. Each one of the program blocks 110, 120, 130 and 140 corresponds to one of the first program groups GPRF1, GPRF2, GPRF3 and GPRF4, and the first group number NGR1 is 4. In addition, a first program voltage VPGM1 is provided to a selected word line WL in the first program groups GPRF1, GPRF2, GPRF3 and GPRF4, and corresponding first program data are provided to bit lines BLs in the first program groups GPRF1, GPRF2, GPRF3 and GPRF4. Here, the first program data for the first program groups GPRF1, GPRF2, GPRF3 and GPRF4 are sequentially provided, and the flash memory cells MCs in the first program groups GPRF1, GPRF2, GPRF3 and GPRF4 are programmed. In the step S215, the program for the flash memory cells MCs in the first program groups GPRF1, GPRF2, GPRF3 and GPRF4 is verified, and the first program verify result is generated.

The second program loop step S220 includes a step S223 and a step S225. In step S223, a plurality of flash memory cells MCs arranged on matrix structure containing word lines WLs and bit lines BLs is divided into multiple second program groups GPRS1 and GPRS2. Program blocks 110 and 120 are correspond to the first program group GPRS1, and program blocks 130 and 140 correspond to the second program group GPRS2. The resulting second group number NGR2 is 2. In addition, a second program voltage VPGM2 is provided to a selected word line WL in the program groups GPRS1 and GPRS2, and corresponding second program data are provided to bit lines BLs in the program groups GPRS1 and GPRS2. The second program data for the program groups GPRS1 and GPRS2 are sequentially provided, and the flash memory cells MCs in the program groups GPRS1 and GPRS2 are programmed. In step S225, the program for the flash memory cells MCs in the second program groups GPRS1 and GPRS2 is verified, and the second program verify result is generated. The second group number NGR2 is less than the first group number NGR1, and the second program voltage VPGM2 is higher than the first program voltage VPGM1. Preferably, the programming method of FIG. 6 is applied to a NAND type flash memory, in which a plurality of flash memory cells MCs is connected to one string STR. According to the programming method of FIG. 6, the total programming time is reduced, compared with conventional programming methods.

In summary, in the flash memory device according to exemplary embodiments of the present invention, the program blocks are serially programmed, reducing the noise peak. In addition, the time interval between program groups or the number of the program groups is decreased from a proceeding program loop to a subsequent program loop in the plurality of program loops, reducing the total program time.

The present invention has been described with reference to an exemplary embodiment illustrated in the drawings, but has been merely exemplified. It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A flash memory device comprising:
a memory array comprising a plurality of flash memory cells arranged in matrix structure comprising a plurality of word lines and a plurality of bit lines, the plurality of flash memory cells divided into multiple program blocks;
a program voltage providing portion in communication with the plurality of flash memory cells to provide a program voltage to a selected word line in the plurality of word lines;
a page buffer portion comprising a plurality of page buffers, each page buffer corresponding to one of the program blocks and in communication with bit lines in its corresponding program block to provide program data to the bit lines of the corresponding program block; and
a control signal generating portion in communication with the plurality of page buffers to provide a plurality of buffer control signals in each one of a sequence of program loops to the plurality of page buffers in accordance with an incremental step pulse program method, the buffer control signals in each program loop sequentially activated with a time interval between subsequent buffer control signals, the time interval decreasing with each loop in the sequence of program loops and the program voltage provided by the program voltage providing unit increasing with each loop in the sequence of program loops.

2. The flash memory device of claim 1, wherein the flash memory device comprises a NAND type flash memory device.

3. A method for programming a flash memory device comprising a plurality of flash memory cells divided into multiple program blocks, the method comprising:
providing during a first program loop a first program voltage to a selected word line in the multiple program blocks and corresponding first program data to bit lines in the multiple program blocks, the first program data for the multiple program blocks sequentially provided to each program block in the multiple program blocks with a first time interval between subsequent program blocks; and
providing during a second program loop following the first program loop a second program voltage to the selected word line in the multiple program blocks and providing corresponding second program data to the bit lines in the multiple program blocks, the second program data for the multiple program blocks sequentially provided to each program block in the multiple program blocks with a second time interval between subsequent program blocks;
wherein the second program voltage is higher than the first program voltage and the second time interval is shorter than the first time interval.

4. The programming method of claim 3, wherein the flash memory device comprises a NAND type flash memory device.

5. A method for programming a flash memory device comprising a plurality of flash memory cells, the method comprising:
dividing during a first program loop the plurality of flash memory cells into multiple first program groups and providing a first program voltage to a selected word line in the multiple first program groups and a corresponding first program data to bit lines in the first program groups, wherein the first program data are sequentially provided to each program group in the multiple first program groups; and
dividing during a second program loop after the first program loop the plurality of flash memory cells into multiple second program groups providing a second program voltage to the selected word line in the multiple second program groups and a corresponding second program data to bit lines in the multiple second program groups, wherein the second program data are sequentially provided to each program group in the multiple second program groups,
wherein the second program voltage is higher than the first program voltage and, a number of program groups in the multiple second program groups is less than a number of program groups in the multiple first program groups.

6. The programming method of claim 5, wherein the flash memory device comprises a NAND type flash memory device.

* * * * *